(12) United States Patent
Choi

(10) Patent No.: US 9,105,524 B2
(45) Date of Patent: Aug. 11, 2015

(54) METHOD OF FABRICATING A THIN FILM TRANSISTOR ARRAY SUBSTRATE

(71) Applicant: LG DISPLAY CO., LTD., Seoul (KR)

(72) Inventor: Hee Dong Choi, Seosan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/079,184

(22) Filed: Nov. 13, 2013

(65) Prior Publication Data

US 2014/0319526 A1  Oct. 30, 2014

(30) Foreign Application Priority Data

Apr. 30, 2013 (KR) .................. 10-2013-0047956

(51) Int. Cl.
| | |
|---|---|
| *H01L 27/12* | (2006.01) |
| *H01L 29/417* | (2006.01) |
| *H01L 29/66* | (2006.01) |
| *H01L 29/786* | (2006.01) |

(52) U.S. Cl.
CPC .......... *H01L 27/1225* (2013.01); *H01L 27/127* (2013.01); *H01L 29/41733* (2013.01); *H01L 29/66765* (2013.01); *H01L 29/7869* (2013.01); *H01L 29/78669* (2013.01); *H01L 29/78678* (2013.01)

(58) Field of Classification Search
CPC ............ H01L 27/1214; H01L 27/1225; H01L 27/127; H01L 29/41733; H01L 29/66765; H01L 29/78669; H01L 29/7869; H01L 29/78678
USPC .......... 257/98, 59, 72; 438/151, 128
See application file for complete search history.

(56) References Cited

U.S. PATENT DOCUMENTS

| | | | |
|---|---|---|---|
| 5,614,728 A | 3/1997 | Akiyama | |
| 5,719,078 A * | 2/1998 | Kim | 438/158 |
| 5,796,116 A | 8/1998 | Nakata et al. | |
| 6,191,530 B1 * | 2/2001 | Fukuta et al. | 313/586 |
| 6,403,407 B1 | 6/2002 | Andry et al. | |
| 7,605,799 B2 | 10/2009 | Amundson et al. | |
| 7,807,486 B2 * | 10/2010 | Kwack | 438/30 |
| 8,018,564 B2 * | 9/2011 | Lee et al. | 349/140 |
| 8,045,078 B2 | 10/2011 | Lim et al. | |
| 8,698,143 B2 * | 4/2014 | Yamazaki et al. | 257/57 |
| 2003/0178656 A1 | 9/2003 | Kwon et al. | |
| 2006/0046335 A1 | 3/2006 | Sarma et al. | |
| 2011/0031491 A1 | 2/2011 | Yamazaki et al. | |

(Continued)

FOREIGN PATENT DOCUMENTS

| | | |
|---|---|---|
| EP | 0 913 860 A2 | 5/1999 |
| JP | 6-242468 A | 9/1994 |
| JP | 2004-6788 A | 1/2004 |

(Continued)

*Primary Examiner* — Nikolay Yushin
(74) *Attorney, Agent, or Firm* — Birch, Stewart, Kolasch & Birch, LLP

(57) ABSTRACT

A thin film transistor array substrate including a gate line and a data line formed on a substrate, the gate and data lines crossing each other; a gate insulation film formed between the gate and data lines; a gate electrode formed at an intersection of the gate and data lines; an active layer formed on the gate insulation film to overlap the gate electrode; an etch stop layer formed on the active layer to define a channel region of the active layer; and a source electrode and a drain electrode formed on the active layer to partially overlap the active layer. The etch stop layer is between the source and drain electrodes, and the source and drain electrodes are spaced apart from the etch stop layer.

8 Claims, 14 Drawing Sheets

(56) References Cited

U.S. PATENT DOCUMENTS

2011/0057186 A1 3/2011 Yamazaki et al.
2011/0248271 A1 10/2011 Choo et al.
2012/0161123 A1 6/2012 Yamazaki
2012/0217500 A1 8/2012 Park et al.
2012/0300151 A1* 11/2012 Yamazaki et al. .............. 349/43

FOREIGN PATENT DOCUMENTS

| JP | 2009-182345 A | 8/2009 |
| JP | 2010-165922 A | 7/2010 |
| JP | 2011-170387 A | 9/2011 |
| WO | WO 2011/013522 A1 | 2/2011 |
| WO | WO 2013/008441 A1 | 1/2013 |

* cited by examiner ically represent electrical information signals. Flat panel display devices,
METHOD OF FABRICATING A THIN FILM TRANSISTOR ARRAY SUBSTRATE The present application claims priority under 35 U.S.C. §119(a) of Korean Patent Application No. 10-2013-0047956 filed on Apr. 30, 2013, which is hereby incorporated by reference in its entirety.

BACKGROUND

1. Field of the Disclosure

The present application relates to a thin film transistor array substrate and a fabricating method thereof. The thin film transistor array prevents generation of an undesirable capacitance through the formation of a channel region with a shorter length to improve drive performance and enhance brightness and picture quality.

2. Description of the Related Art

Display devices can use display fields to visually represent electrical information signals. Flat panel display devices, which have been rapidly replacing the existing cathode ray tubes (CRTs) can be slim and light weight and can operate with low power consumption.

Flat panel display devices can be, for example, liquid crystal display (LCD) devices, organic light emitting display (OLED) devices, electrophoretic display (electric paper display (EPD)) devices, plasma display panel device (PDPs), field emission display (FED) devices, electroluminescence display devices (ELDs), and elector-wetting display (EWD) devices. Flat panel display devices commonly include a flat display panel configured to include a pair of substrates facing each other, the pair of substrates having an inherent light emitting or polarizing material layer therebetween.

Flat display panels can be configured to operate in a passive matrix driving mode or an active matrix driving mode.

The flat display panels configured to operate in the passive matrix driving mode include a plurality of pixels formed at intersections of scan lines and signal lines. The pixels can be driven while signals are applied to the respective scan and signal lines crossing each other. As such, the flat display panels configured to operate in the passive matrix driving mode can be simply controlled but the pixels on the flat display panels cannot be driven independently of one another. Therefore, definition and response speed must be of the flat display panels configured to operate in the passive matrix driving mode is low which makes it difficult to realize a high definition image.

The flat display panels configured to operate in the active matrix driving mode include a plurality of thin film transistors arranged in respective pixels and used as switch elements. Each of the thin film transistors is turned-on/off and to allow the plurality of pixels to be selectively driven. Although the flat display panels configured to operate in the active matrix driving mode require a complex control scheme, the plurality of pixels can be driven independently of one another. As such, the flat display panels configured to operate in the active matrix driving mode can provide high definition and high response speed compared to flat display panels configured to operate in the passive matrix driving mode. Therefore, the flat display panels configured to operate in the active matrix driving mode can easily realize a high definition image.

The flat display panels configured to operate in the active matrix driving mode must necessarily include a transistor array substrate suitable to independently drive the plurality of pixels.

The transistor array substrate includes gate lines and data lines which cross each other and define a plurality of pixels. Also, the transistor array substrate includes a plurality of thin film transistors opposite to the plurality of pixels. The plurality of thin film transistors are each arranged at intersections of the gate lines and the data lines.

Each of the thin film transistors includes a gate electrode connected to one of the gate lines, a source electrode connected to one of the data lines, a drain electrode connected to a respective pixel electrode, and an active layer forming a channel region between the source electrode and the drain electrode according to a voltage level of the gate electrode. The active layer overlaps at least part of the gate electrode with a gate insulation layer therebetween. Such thin film transistors can be selectively turned-on by a signal on the respective gate line. Another signal on the respective data line is transferred to the respective pixel electrode.

Thin film transistors can be a-Si (amorphous silicon) thin film transistors, oxide thin film transistors, and LTPS (low temperature poly-silicon) thin film transistors. Oxide thin film transistors require an annealing process for the active layer. Moreover, an etch stop layer for protecting a channel region of the active layer can be formed, and a portion of the active layer overlapping the etch stop layer can be defined as the channel region. As such, the etch stop layer must partially overlap the source electrode and the drain electrode. Also, it is necessary to secure a process margin for the overlapping regions. Due to this, the length of the channel region in oxide thin film transistors can be longer than desired which causes the size of the oxide thin film transistors to be increased and the current capability to be greatly deteriorated.

Also, the source electrode and the drain electrode overlap the etch stop layer, the active layer and the gate electrode. Because the source electrode and the drain electrode overlap the gate electrode, an undesirable capacitance is formed between the source and drain electrodes, and the gate electrode. The undesirable capacitance negatively impacts the driving scheme of oxide thin film transistors, which does not occur for other types of thin film transistors. As such, oxide thin film transistors cannot be driven at as high of a speed.

Moreover, fabricating methods of thin film transistor array substrates according to related art generally include forming a gate line and a gate electrode, forming an active layer, forming an etch stop layer, forming a data line and source electrode and drain electrode, forming a passivation film, and forming a pixel electrode. Six masks are used to perform the formation processes which increases process time (or period) and fabrication costs.

BRIEF SUMMARY

Accordingly, the present application is directed to a thin film transistor array substrate and a fabricating method thereof that substantially obviates one or more problems due to the limitations and disadvantages of the related art.

An aspect of the present application is to provide a thin film transistor array substrate and a fabricating method thereof to reduce undesirable parasitic capacitance and enhance high-speed driving performance by forming source and drain electrodes that do not overlap a gate electrode.

Also, the thin film transistor array substrate of the current application has a channel region with a shorter length to increase performance of the thin film transistor array substrate and to improve the brightness and quality of display panels. The length of the channel region is a distance of the channel region between the source and drain electrodes, and the length of the channel region includes the current path between the source and drain electrodes.

Moreover, the thin film transistor array substrate and fabricating method thereof are adapted to reduce the number of masking procedures and decrease process time and fabrication costs by forming an etch stop layer of a thin film transistor through a rear exposure which uses a gate electrode as a mask.

Additional features and advantages of the embodiments will be set forth in the description which follows, and in part will be apparent from the description, or may be learned by practice of the invention. The advantages of the invention will be realized and attained by the structure particularly pointed out in the written description and claims hereof as well as the appended drawings.

According to an general aspect of the present embodiment, a thin film transistor array substrate includes a gate line and a data line formed on a substrate, the gate and data lines crossing each other; a gate insulation film formed between the gate and data lines; a gate electrode formed at an intersection of the gate and data lines; an active layer formed on the gate insulation film to overlap the gate electrode; an etch stop layer formed on the active layer to define a channel region of the active layer; and a source electrode and a drain electrode formed on the active layer to partially overlap the active layer. The etch stop layer is between the source and drain electrodes, and the source and drain electrodes are spaced apart from the etch stop layer.

A fabricating method of the thin film transistor array substrate according to another general aspect of the present embodiment includes forming a gate electrode on a substrate; forming a gate insulation film on the substrate on the gate electrode; forming an active layer on the gate insulation film; forming an etch stop layer to define a channel region of the active layer; and sequentially forming a barrier layer and a metal layer on the gate insulation film, the active layer, and the etch stop layer. The etch stop layer is between the source and drain electrodes, and the source and drain electrodes are spaced apart from the etch stop layer.

Other systems, methods, features and advantages will be, or will become, apparent to one with ordinary skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiments of the present disclosure and together with the description serve to explain the disclosure. In the drawings.

DETAILED DESCRIPTION OF THE EMBODIMENTS

Figure 1:
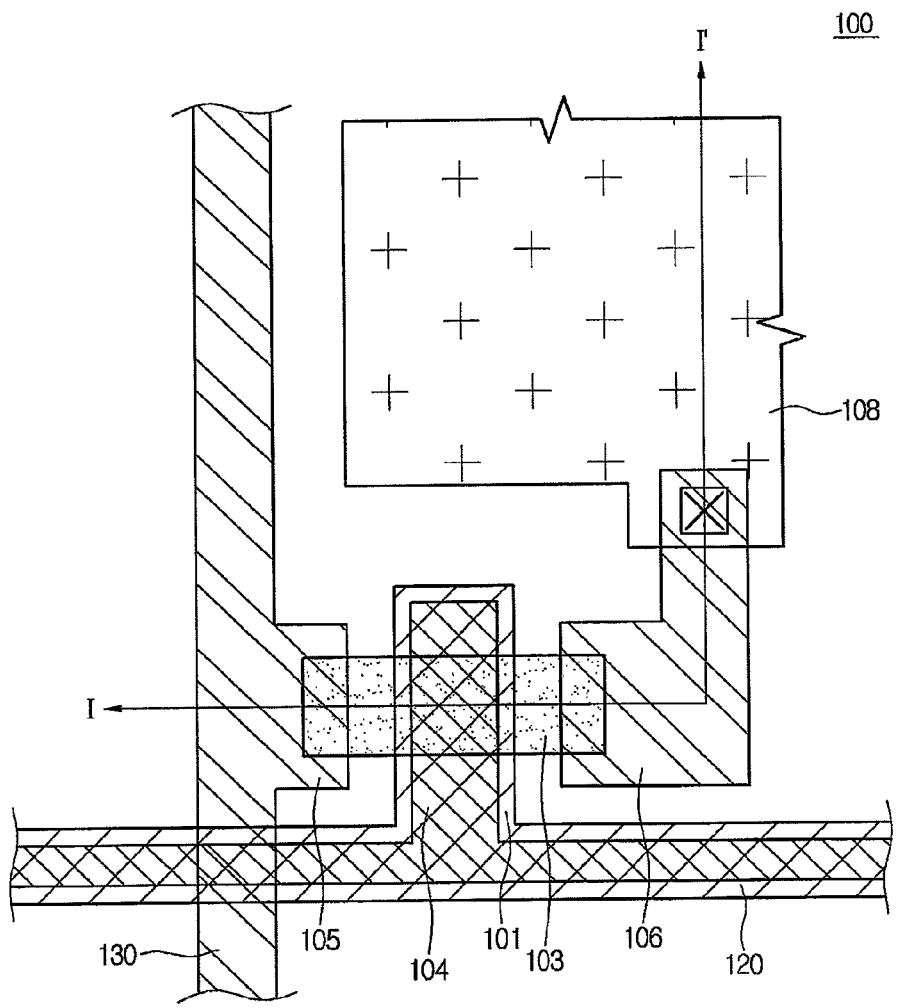
FIG. 1 is a planar view showing an example of a thin film transistor array substrate according to a first embodiment of the present disclosure.

Reference will now be made in detail to the embodiments of the present disclosure, examples of which are illustrated in the accompanying drawings. The embodiments introduced hereinafter are provided as examples in order to convey the spirit of the invention to one of ordinary skill in the art. Therefore, features of these embodiments are not limited to the shapes described here. In the drawings, sizes and thicknesses of the device have been exaggerated for convenience of explanation. Wherever possible, the same reference numbers will be used throughout this disclosure including the drawings to refer to the same or like parts.

FIG. 1 is a planar view showing an example of a thin film transistor array substrate according to a first embodiment of the present disclosure.

Referring to FIG. 1, the thin film transistor array substrate according to the first embodiment of the present disclosure includes a gate line 120 formed along one direction in a substrate 100, and a data line 130 formed along another direction perpendicular to the gate line 120. The substrate 100 includes a display area and a non-display area. The gate line 120 and the data line 130 crossing each other define a pixel region within the display area of the substrate 100. The thin film transistor array substrate further includes a thin film transistor formed at an intersection of the gate line 120 and the data line 130, and a pixel electrode 108 connected to the thin film transistor through a contact hole. The thin film transistor can be an oxide semiconductor thin film transistor.

The thin film transistor includes a gate electrode 101, a gate insulation film, an active layer 103, a source electrode 105 and a drain electrode 106. The gate electrode 101 is formed in such a manner as to protrude from the gate line 120. The source electrode 105 is formed in such a manner as to branch out from the data line 130. The drain electrode 106 is formed in the same layer as the source electrode 105 and in such a manner as to be separate from the source electrode 105. Also, the thin film transistor can include an etch stop layer 104 on the active layer 103. The etch stop layer 104 can define a channel region of the active layer 103.

The source electrode 105 and the drain electrode 106 can include a first electrode layer and a second electrode layer. The first electrode layer can be formed from materials that are different than the materials from which the second electrode layer can be formed. Also, the first electrode layer and the second electrode layer can be patterned independently of each other through different etching processes from each other.

The etch stop layer 104 and the source electrode 105 and drain electrode 106 are formed on the active layer 103 in the same layer and partially overlap the active layer 103. The etch stop layer 104 is disposed between the source electrode 105 and the drain electrode 106. Moreover, the etch stop layer 104 is separated from not only the source electrode 105 but also the drain electrode 106. Furthermore, the etch stop layer 104 can be formed within a region which is occupied by the gate electrode 101 and the gate line 120. In other words, the etch stop layer 104 can be formed in such a manner as to overlap the gate electrode 101 and the gate line 120.

In this manner, the etch stop layer 104 is formed in such a manner as to be separate from the source electrode 105 and the drain electrode 106. As such, a channel region of the active layer 103 defined by the etch stop layer 104 can be formed to have a shorter length than that of the related art. In other words, because it is unnecessary to maintain a process margin of the overlapping of the etch stop layer 104 with the source and drain electrodes 105 and 106, the length of the channel region can be shortened. The shortened channel region length allows current capacity and performance of the thin film transistor to be enhanced. Therefore, reliability, brightness and picture quality of a display panel including the above-mentioned thin film transistor array substrate can be enhanced.

Also, the thin film transistor according to the present disclosure is formed in such a manner as to separate the source electrode 105 and drain electrode 106 from the gate electrode 101. On the other hand, the thin film transistor of the related art forces not only the source electrode to overlap the gate electrode but also the drain electrode to overlap the gate electrode. Due to this, undesirable parasitic capacitance is generated in thin film transistors in related art. However, the thin film transistor of the present disclosure can reduce the generation of undesirable parasitic capacitance because the source electrode 105 and drain electrode 106 are formed without overlapping the gate electrode 101. As such, the parasitic capacitance can be reduced, and furthermore the thin film transistor can be driven at a higher speed.

A method of fabricating a thin film transistor array substrate will now be described referring to cross-sectional views which show sectional structures of the substrate taken along a line I-I' of FIG. 1.

FIGS. 2A through 2I illustrate cross-sectional views, taken along a line I-I' of FIG. 1, of a fabricating method of a thin film transistor array substrate according to the first embodiment of the present disclosure.

Figure 2A:
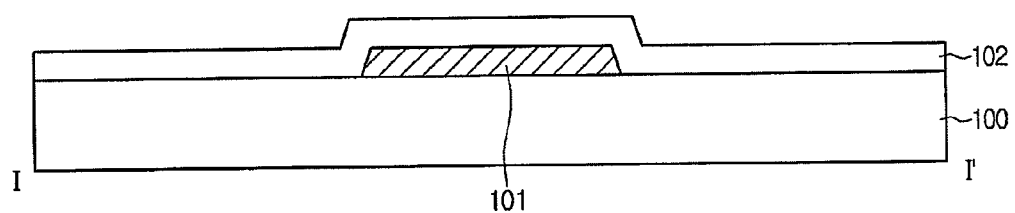
FIGS. 2A through 2I are cross-sectional views illustrating an example of a fabricating method of the thin film transistor array substrate according to the first embodiment of the present disclosure.

Referring to FIG. 2A, a gate electrode 101 is formed on a substrate 100. Also, a gate line 120 (refer to FIG. 1) is simultaneously formed on the substrate 100 at the formation the gate electrode 101. To this end, a gate metal layer is formed on the substrate 100, and a first photoresist is coated on the gate metal layer. Also, the first photoresist is patterned into a first photoresist pattern by being exposed and developed using a first mask which includes a transmission portion and an interception portion. Subsequently, the gate metal layer is patterned into the gate line 120 and the gate electrode 101 protruding therefrom by being etched using the first photoresist pattern as an etching mask. Thereafter, a gate insulation film 102 is formed on the entire surface of the substrate 100 provided with the gate electrode 101.

The substrate 100 can be formed from, for example, one of silicon, glass, a plastic material, and polyimide (PI). The gate electrode 101 can be formed from an opaque metal material. The gate electrode 101 can be formed from, for example, at least one selected from a metal material group of aluminum Al, tungsten W, copper Cu, molybdenum Mo, chromium Cr, tantalum Ta, titanium Ti, and alloys thereof. Although the gate electrode 101 shown in the drawings is formed in a single layer structure, the gate electrode 101 can be formed in a multi-layer structure including at least two layers. The gate insulation film 102 can be formed from one of a dielectric material, a high dielectric constant material and a mixture thereof. The dielectric material can include, for example, $SiO_x$, $SiN_x$, $HfO_2$, $Al_2O_3$, $Y_2O_3$, and $Ta_2O_5$. Also, the gate insulation film 102 can be formed in a multi-layer structure including at least two layers, even though the gate insulation film 102 shown in the drawings is formed in a single layer structure.

Figure 2B:
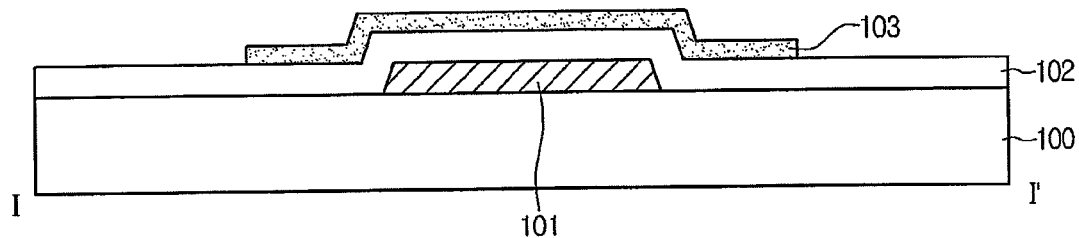

As shown in FIG. 2B, an active layer 103 is formed on the gate insulation film 102 to overlap at least a part of the gate electrode 101. The active layer 103 can be prepared by coating a semiconductor material on the gate insulation film 102, forming a second photoresist on the semiconductor material, patterning the second photoresist into a second photoresist pattern through exposure and development processes which use a second mask including a transmission portion and an interception portion, and patterning the semiconductor material into the active layer 103 of a thin film transistor through an etch process which uses the second photoresist pattern as an etching mask. The second photoresist pattern is formed within a region occupied by the gate electrode 101. Also, an annealing process can be additionally performed for the active layer 103.

The active layer 103 can be formed from an oxide semiconductor material of $A_xB_yCzO$ (x, y and x≥0) known to have higher mobility and a more stable constant-current property than those of a silicon semiconductor material. Each ingredient A, B and C of the oxide semiconductor material can be one material selected from a material group consisting of zinc Zn, cadmium Cd, gallium Ga, indium In, tin Sn, hafnium Hf and zirconium Zr. The active layer 103 is preferably formed from one of ZnO, $InGaZnO_4$, ZnInO, ZnSnO, InZnHfO, SnInO and SnO, but the present disclosure is not limited to this.

Figure 2C:
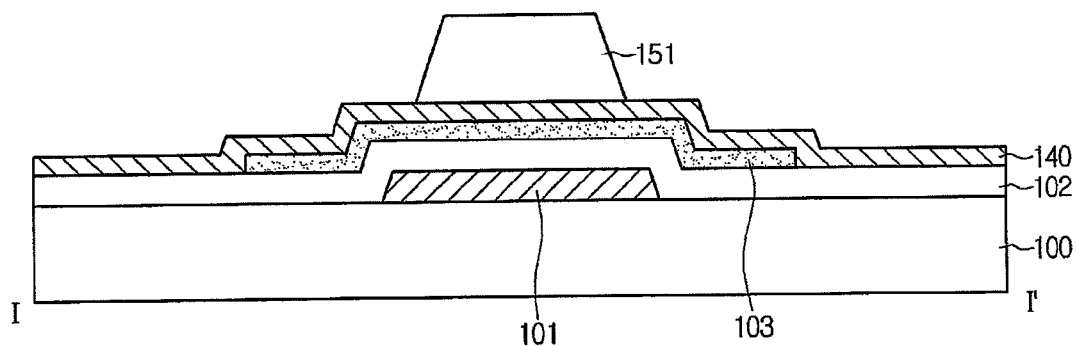

Referring to FIG. 2C, an active protection layer 140 is formed on an entire surface of the substrate 100 provided with the active layer 103. Also, a third photoresist pattern 151 is formed on a partial region of the active protection layer 140 overlapping the gate electrode 101. The active protection layer 140 can be formed from silicon dioxide $SiO_2$, but it is not limited to this.

Figure 2D:
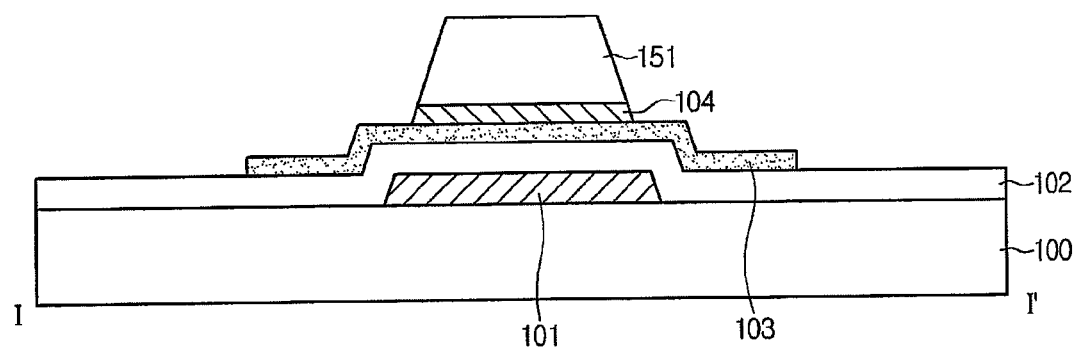

As shown in FIG. 2D, an etch stop layer 104 is formed by etching the active protection layer 140 using the third photoresist pattern 151 as an etching mask. The etch stop layer 104 is formed on a partial region of the active layer 103 overlapping the gate electrode 101 and used to define a channel region of the active layer 103. Also, the etch stop layer 104 can be formed in not only a region occupied by the gate electrode 101 but also another region occupied by the gate line. In other words, the etch stop layer 104 can be formed to overlap the gate electrode and the gate line.

The etch stop layer 104 does not overlap source and drain electrodes which are formed later. As such, it is unnecessary to consider a process margin for the regions of the etch stop layer 104 overlapping the source and drain electrodes. Also, it is not necessary to form the etch stop layer 104 in an undesirable region, which includes any region of the thin film transistor array substrate except for the channel region of the active layer 103. Therefore, the channel region of the thin film transistor according to the present disclosure can be shortened to no more than half of that of thin film transistors in related art, which include the etch stop layer overlapping the source and drain electrodes, in length. The shortened channel region length can enhance current capacity and performance of the thin film transistor. In accordance therewith, brightness, picture quality and reliability of a display panel including the above-mentioned thin film transistor array substrate can be enhanced.

Figure 2E:
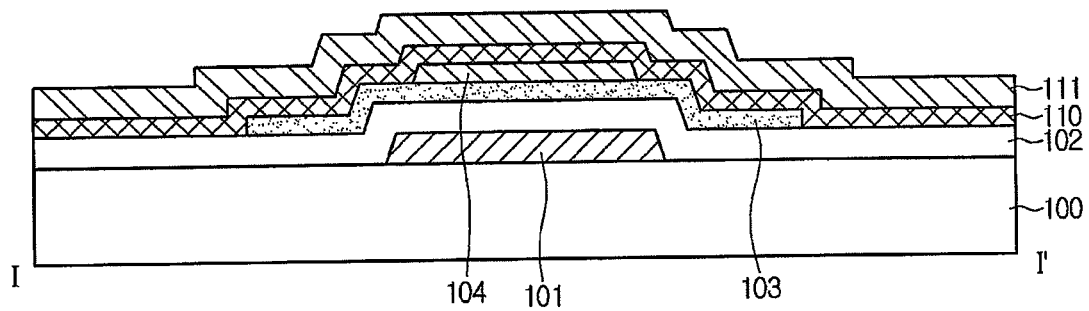

Referring to FIG. 2E, a barrier layer 110 can be formed, for example, on the entire surface of the substrate 100 provided with the etch stop layer 104, and a metal layer 111 can be formed, for example, on the barrier layer 110. The metal layer 111 and the barrier layer 110 can be formed by wet-etching and dry-etching materials. The metal layer 111 and the barrier layer 110 can be formed by selecting the etching method and selectively etching the metal layer 111 or the barrier layer 110 separately. The metal layer 111 can be formed more easily by wet-etching materials, in comparison to the barrier layer 110. The materials that can be used to form the metal layer 111 include molybdenum Mo, copper Cu, and aluminum A. The barrier layer 110 can be formed more easily by dry-etching materials, in comparison to the metal layer 111. The materials that can be used to form the barrier layer 110 include molybdenum-titanium alloy MoTi.

Figure 2F:
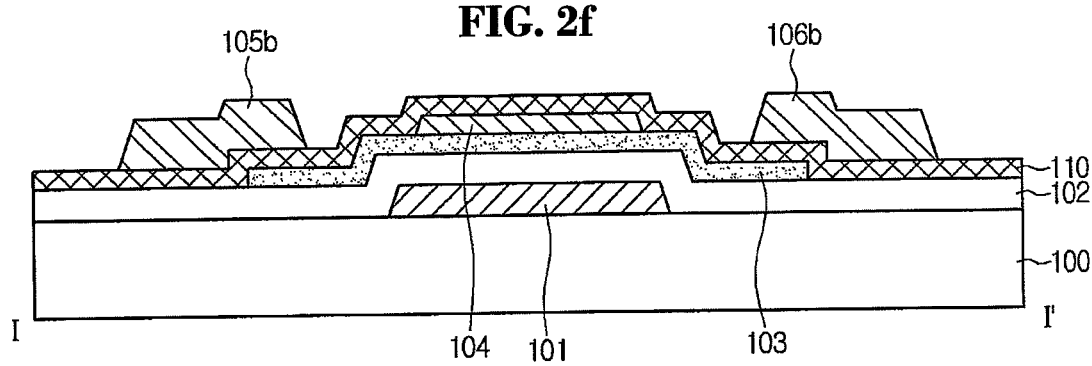

The metal layer 111 is patterned into a second source electrode layer 105b and a second drain electrode layer 106b as shown in FIG. 2F. Moreover, a data line layer, for example, can be formed through the patterning process of the metal layer 111. More specifically, a fourth photoresist is formed on the metal layer 111 and patterned into a fourth photoresist pattern through exposure and development processes which use a fourth mask including transmission portions and an interception portion. Also, the metal layer 111 is etched using the fourth photoresist pattern as an etching mask, thereby forming the second source electrode layer 105b and the second drain electrode layer 106b. The metal layer 111 can be etched in a wet etching method.

The second source electrode layer 105b and the second drain electrode layer 106b are formed in such manner as to be separate from each other, the second source electrode layer 105b and the second drain electrode layer 106b partially overlapping the active layer 103. Also, the second source electrode layer 105b and the second drain electrode layer 106b are separated from the etch stop layer 104 and arranged with the etch stop layer 104 therebetween. In other words, not only is the second source electrode layer 105b formed in a region on the barrier layer 110 not occupied by the etch stop layer 104, but also the second drain electrode layer 106b is formed in another region on the barrier layer 110 not occupied by the etch stop layer 104. Also, the second source electrode layer 105b and the second drain electrode layer 106b are formed in regions not overlapping the gate electrode 101.

Although the metal layer 111 is wet-etched, the active layer 103 is not exposed directly to an etchant because the barrier layer 110 is under the metal layer 111. In other words, the active layer 103 is prevented from being degenerated from a semiconductor into a conductor through a chemical reaction with the etchant. Therefore, the active layer 103 does not lose its semiconductor properties. Consequently, the active layer 103 can be protected by the barrier layer 110 even though the etch stop layer 103 does not overlap the source electrode and the drain electrode.

Figure 2G:
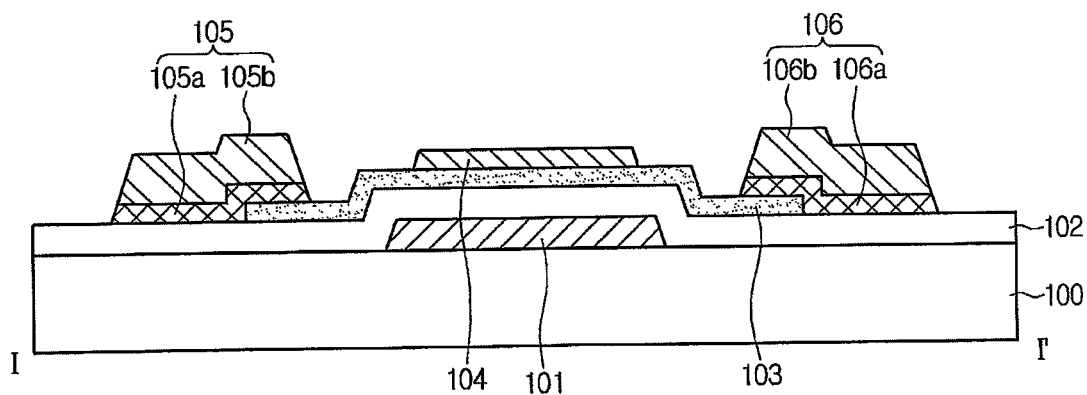

As shown in FIG. 2G, the barrier layer 110 is etched and patterned into a first source electrode layer 105a and a first drain electrode layer 106a. At this time, a first data line layer, for example, can be formed together with the first source and drain electrode layers 105a and 106a. The first source electrode layer 105a and second source electrode layer 105b form a source electrode 105, and the first drain electrode layer 106a and second drain electrode layer 106b form a drain electrode 106. Also, a data line is formed together with the source electrode 105 and drain electrode 106 through the etching processes of the metal layer 111 and the barrier layer 110. The barrier layer 110 is etched using the second source electrode layer 105b and the second drain electrode layer 106b as an etching mask. Also, the barrier layer 110 can be etched in a dry etching method.

The source electrode 105 and the drain electrode 106 are formed in the same layer as the etch stop layer 104. Also, the source electrode 105 and the drain electrode 106 are formed in the regions which partially overlap the active layer 103 but do not overlap the etch stop layer 104. In other words, the source electrode 105 and the drain electrode 106 have the etch stop layer 104 therebetween and the source electrode 105 and the drain electrode 106 are separated from the etch stop layer 104. As such, a channel region of the active layer 103 defined by the etch stop layer 103 is shortened in length. In accordance therewith, performance of the thin film transistor can be enhanced, and brightness and picture quality of a display panel including the above-mentioned thin film transistor array substrate can be improved.

If the source electrode 105 and drain electrode 106 overlap the gate electrode 101, undesirable parasitic capacitance is generated and the driving speed of the thin film transistor is lowered. However, the source electrode 105 and drain electrode 106 are formed to overlap the gate electrode 101. As such, undesirable parasitic capacitance is not generated between the source electrode 105 and the gate electrode 101, and between the drain electrode 106 and the gate electrode 101. In accordance therewith, the thin film transistor and the display panel with the same can be driven at a high speed.

Figure 2H:
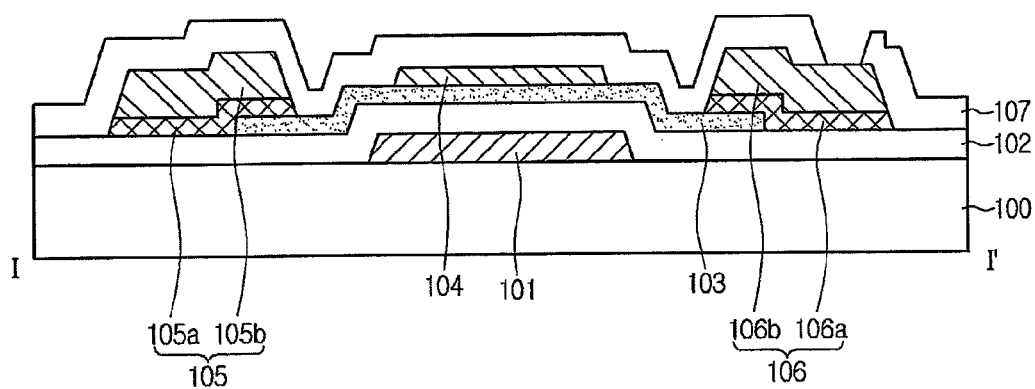

Referring to FIG. 2H, a passivation film 107 is formed on the entire surface of the substrate 100, wherein the source electrode 105 and drain electrode 106 are formed on the substrate 100. Also, a contact hole exposing part of the drain electrode 106 is formed in the passivation film 107. The contact hole can be formed by coating a fifth photo resist on the passivation film 107, patterning the fifth photoresist into a fifth photoresist pattern through the exposure and development processes which use a fifth mask including a transmission portion and an interception portion, and etching the passivation film 107 using the fifth photoresist pattern as an etching mask.

Figure 2I:
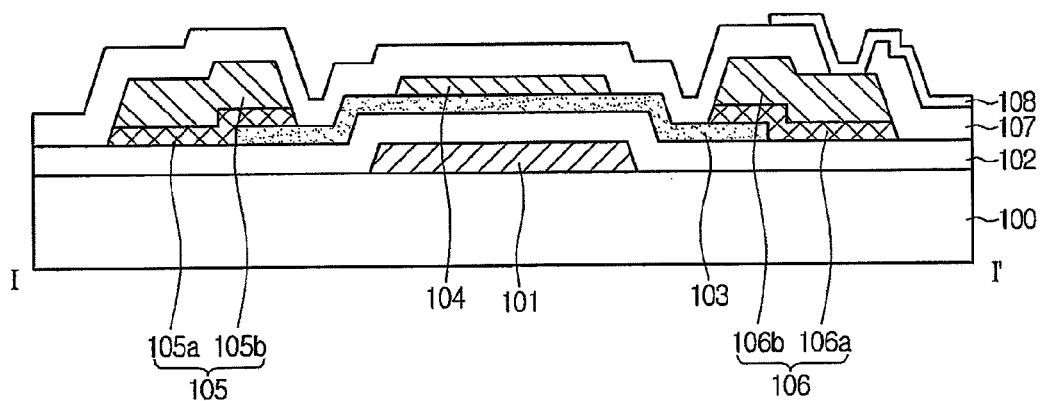

As shown in FIG. 2I, a pixel electrode 108 is formed on the passivation film 107, the passivation film 107 including the contact hole. The pixel electrode 108 is formed throughout a pixel region which is defined by the gate line and the data line crossing each other. Also, the pixel electrode 108 is formed in such a manner as to be separate from the gate line and the data line. Moreover, the pixel electrode 108 can be formed from one material selected from a transparent conductive material group which includes, for example, indium tin oxide ITO, indium zinc oxide IZO, and indium tin zinc oxide ITZO. Furthermore, the pixel electrode 108 is electrically connected to the drain electrode 106 via the contact hole.

Figure 3A:
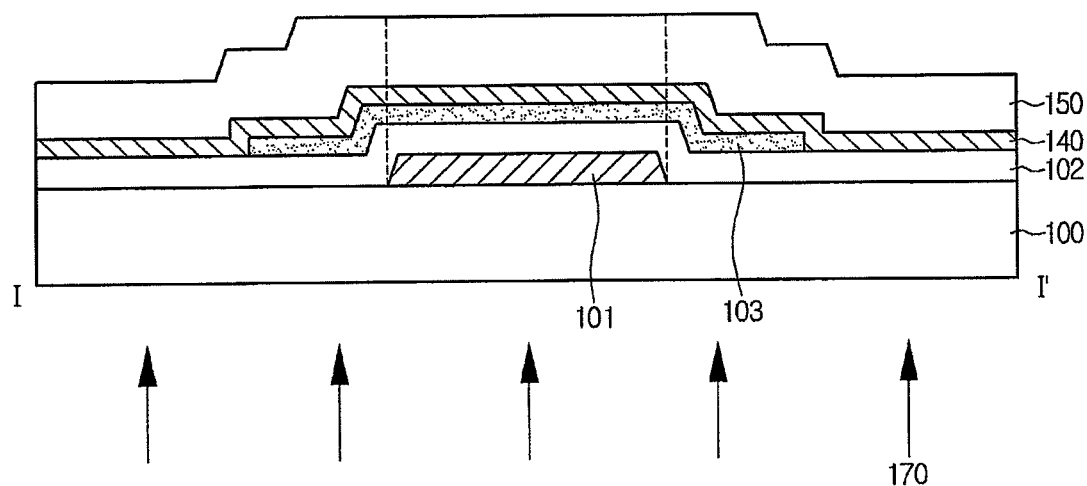
FIGS. 3A and 3B are cross-sectional views illustrating examples of methods which form an etch stop layer of the thin film transistor array substrate according to the first embodiment of the present disclosure.
Figure 3B:
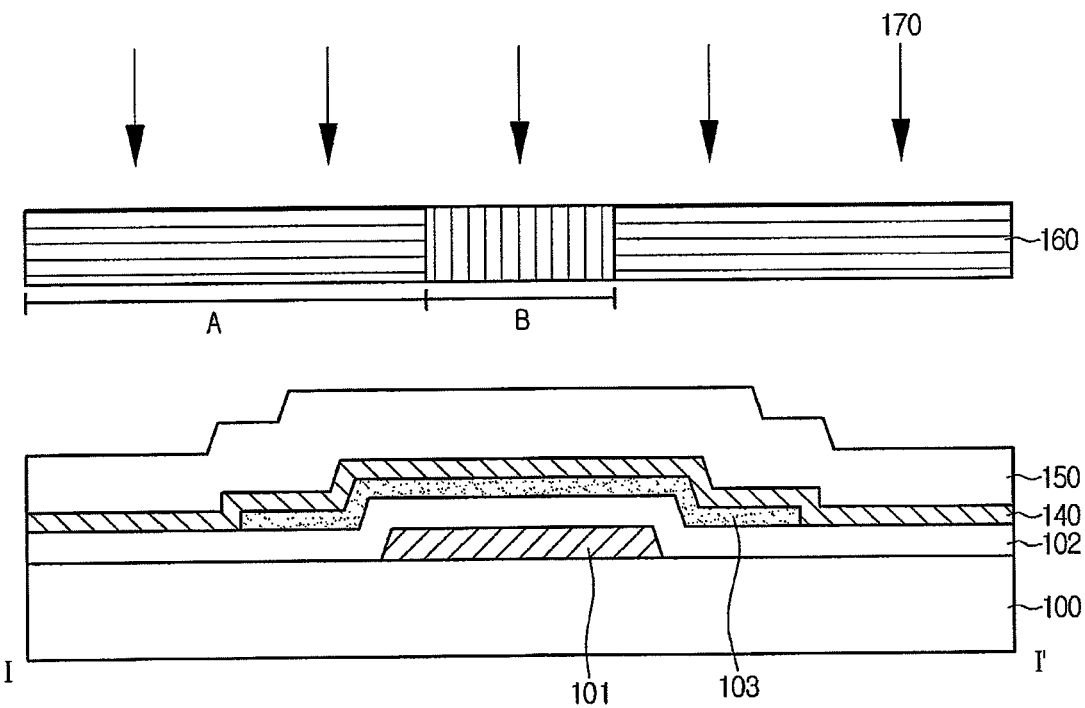

FIGS. 3A and 3B are cross-sectional views illustrating examples of methods which form an etch stop layer of the thin film transistor array substrate according to the first embodiment of the present disclosure.

A first method of forming the third photoresist pattern 151, for example, can use a rear exposure process illustrated in FIG. 3A. The first method includes forming a third photoresist 150 on the active protection layer 140 and exposing the third photoresist 150 to light 170 which is irradiated from the rear direction of the substrate 100. At this time, the gate electrode 101 is used as an interception mask. As such, a partial region of the third photoresist 150 not overlapping the gate electrode 101 is exposed to light. Also, the third photoresist 150 can be a positive photoresist. The positive photoresist is a photo-sensitive material which is softened by being irradiated to light and removed to allow the photoresist 150 to be patterned into the third photoresist pattern 151 overlapping the gate electrode 101. The third photoresist pattern 151 is also formed in another region being occupied by the gate line. In other words, the third photoresist pattern 151 can be formed in such a manner as to overlap the gate electrode 101 and the gate line.

Such a rear exposure process using the gate electrode 101 (and the gate line) allows the third photoresist pattern 151 to be formed without an additional mask. As such, the fabricating method of the thin film transistor array substrate according to the present disclosure can reduce the number of masking procedures and decrease process time and fabrication costs, unlike that of the related art.

A second method of forming the third photoresist pattern 151 can, for example, employ a mask exposure process illustrated in FIG. 3B. A third photoresist 150 is formed on the active protection layer 140 and exposed to light 170 passing through a third mask 160 which includes a transmission portion and an interception portion. The third photoresist 150 can be formed from a positive photoresist or a negative photoresist. The negative photoresist is a light-sensitive material which is hardened by being exposed to light.

If the positive photoresist is used as the third photoresist 150, the third mask 160 can include the interception portion opposite to a region overlapping with the gate electrode 101 (and the gate line) and the transmission portion opposite to the rest region not overlapping with the gate electrode 101 (and the gate line). On the contrary, when the negative photoresist is used as the third photoresist 150, the third mask 160 can include the transmission portion opposite to a region overlapping the gate electrode 101 (and the gate line) and the interception portion opposite to the region not overlapping the gate electrode 101 (and the gate line). As such, only a part of the third photoresist 150 overlapping the gate electrode 101 (and the gate line) is hardened or not softened to allow the third photoresist pattern 150 to be formed in a partial region (of the active protection layer 140) overlapping with the gate electrode 101 (and the gate line).

Subsequently, thin film transistor array substrates according to second through seventh embodiments of the present disclosure will be described. However, the descriptions of the second through seventh embodiment overlapping that of the first embodiment will be omitted.

Figure 4:
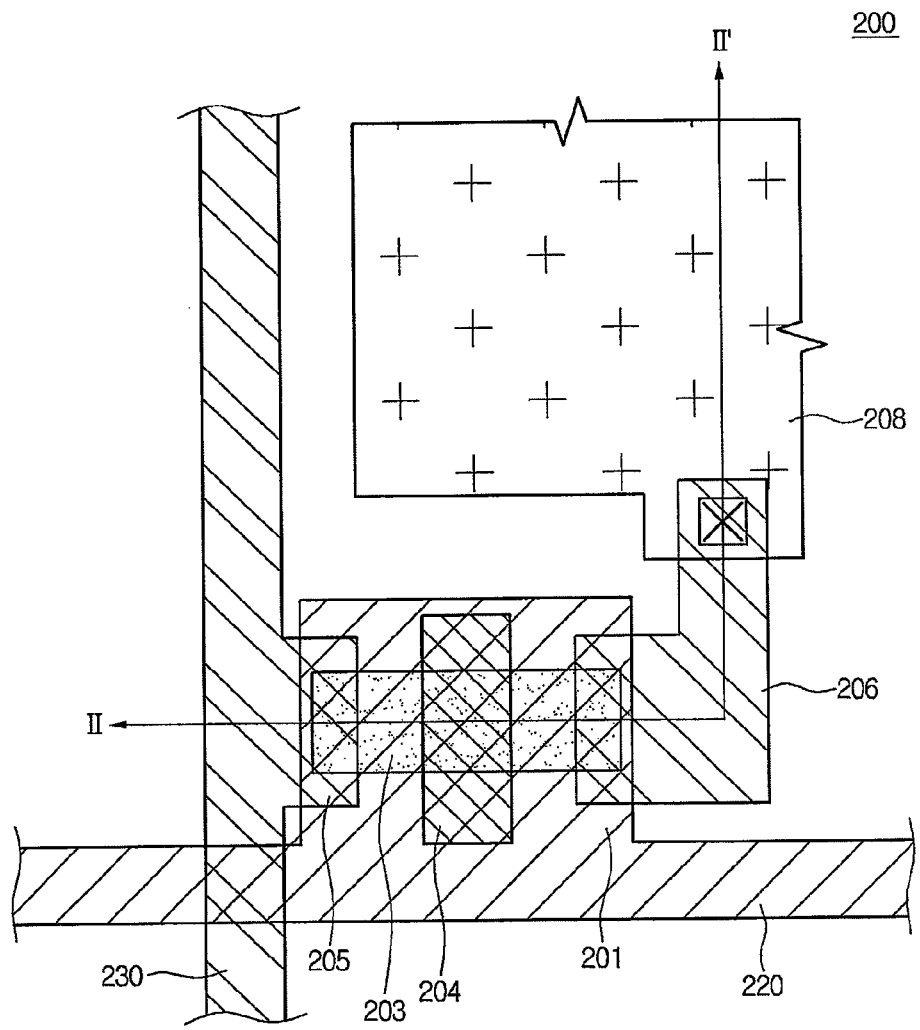
FIG. 4 is a planar view showing an example of a thin film transistor array substrate according to a second embodiment of the present disclosure.

FIG. 4 is a planar view showing a thin film transistor array substrate according to a second embodiment of the present disclosure.

Referring to FIG. 4, the thin film transistor array substrate according to the second embodiment of the present disclosure includes a gate line 220 formed along one direction in a substrate 200, and a data line 230 formed along another direction perpendicular to the gate line 220. The substrate 200 includes a display area and a non-display area. The gate line 220 and the data line 230 crossing each other define a pixel region within the display area of the substrate 200. The thin film transistor array substrate further includes a thin film transistor formed at an intersection of the gate line 220 and the data line 230, and a pixel electrode 208 connected to the thin film transistor through a contact hole. The thin film transistor can be an oxide semiconductor thin film transistor.

The thin film transistor includes a gate electrode 201, a gate insulation film, an active layer 203, a source electrode 205 and a drain electrode 206. The gate electrode 201 is formed in such a manner as to protrude from the gate line 220. The source electrode 205 is formed in such a manner as to branch out from the data line 230. The drain electrode 206 is formed in the same layer as the source electrode 205, the drain electrode 206 being separate from the source electrode 205. Also, the thin film transistor can include an etch stop layer 204 on the active layer 203. The etch stop layer 204 can define a channel region of the active layer 203.

The source electrode 205 and the drain electrode 206 can include a first electrode layer and a second electrode layer. The first electrode layer can be formed from materials that are different than the materials from which the second electrode layer can be formed. Also, the first electrode layer and the second electrode layer can be patterned independently of each other through different etching processes from each other.

The etch stop layer 204 and the source electrode 205 and drain electrode 206 are formed on the active layer 203 in the same layer and partially overlap the active layer 203. Also, the etch stop layer 204 is disposed between the source electrode 205 and the drain electrode 206. Moreover, the etch stop layer 204 is separated from not only the source electrode 205 but also the drain electrode 206.

The active layer 203 is formed only within a region occupied by the gate electrode 101. In other words, the active layer 203 is formed only over the gate electrode 201. As such, the active layer 203 can be formed in a flat structure without any step height. If the active layer 203 is formed in another region not overlapping the gate electrode 201 as well as the overlapping region with the gate electrode 201, a step height is generated in the active layer 203. Due to this, in related art, the active layer 203 can be disconnected at its bent portion (or region). However, the thin film transistor according to a second embodiment of the present disclosure enables the active layer 203 to be formed only over the gate electrode 201. As such, disconnection of the active layer 203 can be prevented.

A method of fabricating a thin film transistor array substrate according to the second embodiment of the present disclosure will now be described referring to cross-sectional views which show sectional structures of the substrate taken along a line II-II' of FIG. 4.

FIGS. 5A through 5G are cross-sectional views illustrating examples of a fabricating method of a thin film transistor array substrate according to the second embodiment of the present disclosure.

Figure 5A:
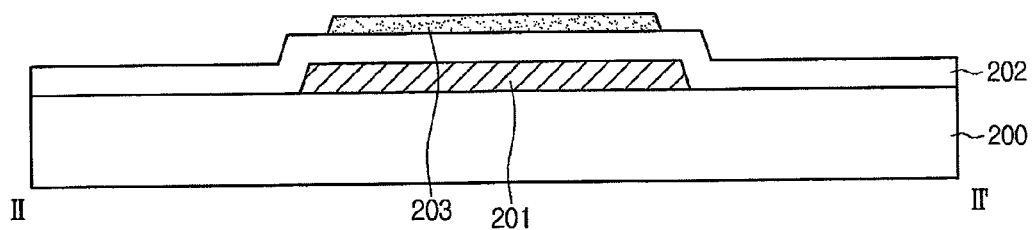
FIGS. 5A through 5G are cross-sectional views illustrating examples of a fabricating method of the thin film transistor array substrate according to the second embodiment of the present disclosure.

Referring to FIG. 5A, a gate electrode 201 is formed on a substrate 200, and a gate insulation film 202 is formed on the entire surface of the substrate 200 provided with the gate electrode 201. Also, an active layer 203 is formed on the gate insulation film 202. An annealing process is additionally performed for the active layer 203. Each of the gate electrode 201 and the active layer 203 can be formed through a photoresist procedure which uses a mask.

The active layer 203 is formed only within a region occupied by the gate electrode 101. As such, the active layer 203 can be formed in a flat structure without any step height. If the active layer 203 is formed in another region not overlapping the gate electrode 201 as well as the overlapping region with the gate electrode 201, a step height is generated in the active layer 203. Due to this, in related art, the active layer 203 can be disconnected at its bent portion (or region). However, the active layer 203 is formed only over the gate electrode 201. As such, disconnection of the active layer 203 can be prevented.

Figure 5B:
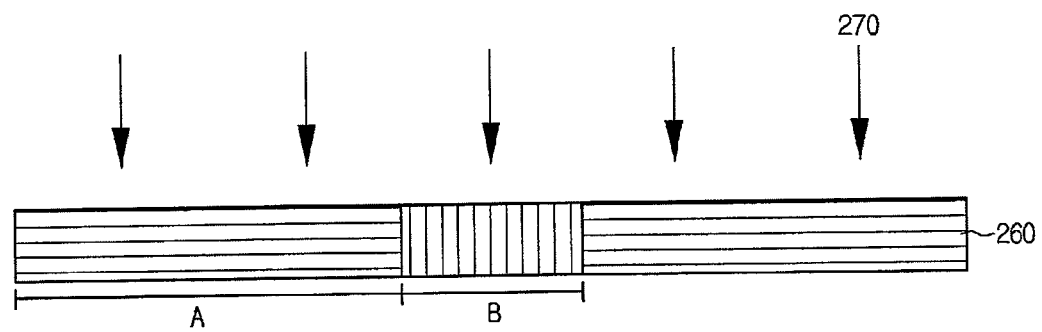
Figure 5B:
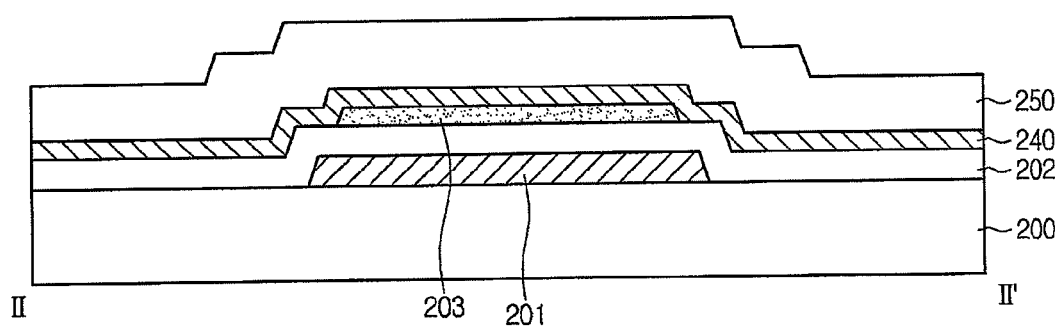

Referring to FIG. 5B, an active protection layer 240 and a photoresist 250 are sequentially formed on the entire surface of the substrate 200 provided with the active layer 203. Also, the photoresist 250 is exposed to light passing through a mask which includes a transmission portion A and an interception portion B. The light-exposed photoresist 250 is patterned into a photoresist pattern 251 through a development process. The photoresist pattern 251 is formed on a partial region of the active protection layer 240 overlapping the gate electrode 201. The photoresist 250 can be, for example, a positive photoresist or a negative photoresist.

Figure 5C:
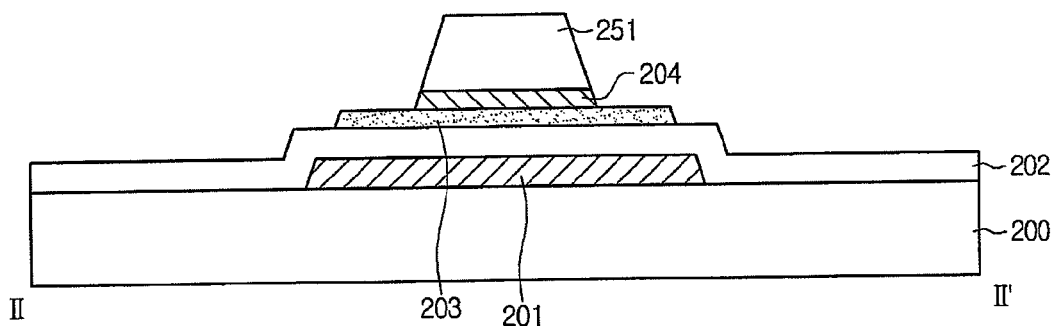

Referring to FIG. 5C, an etch stop layer 204 is formed by etching the active protection layer 240 using the photoresist pattern 251 as an etching mask. The etch stop layer 204 is formed in such a manner as to cover a part of the active layer 203 within the occupying region of the gate electrode 201. The etch stop layer 204 is used to define a channel region of the active layer 203. The etch stop layer 204 does not overlap source electrode and drain electrodes which will be formed later. As such, it is unnecessary to consider a process margin for the overlapping regions of the etch stop layer 204 and the source electrode and drain electrodes. Also, it is not necessary to form the etch stop layer 204 in an undesirable region, which includes any region of the thin film transistor array substrate except for the channel region of the active layer 203. Therefore, the channel region of the thin film transistor according to the present disclosure can be shortened to no more than half of that of thin film transistors in related art, which includes the etch stop layer overlapping the source electrode and drain electrodes, in length. The shortened channel region can enhance current capacity and performance of the thin film transistor. In accordance therewith, brightness, picture quality and reliability of a display panel including the above-mentioned thin film transistor array substrate can be enhanced.

Figure 5D:
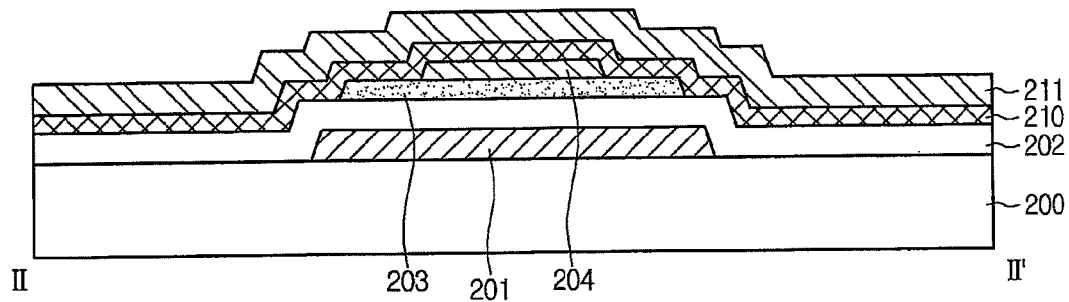

Referring to FIG. 5D, a barrier layer 210 is formed on the entire surface of the substrate 200 provided with the etch stop layer 204, and a metal layer 211 is formed on the barrier layer 210. The barrier layer 210 and the metal layer 211 can be formed from different materials. Also, the metal layer 211 can be formed from a wet-etchable material, and the barrier layer 210 can be formed from a dry-etchable material.

Figure 5E:
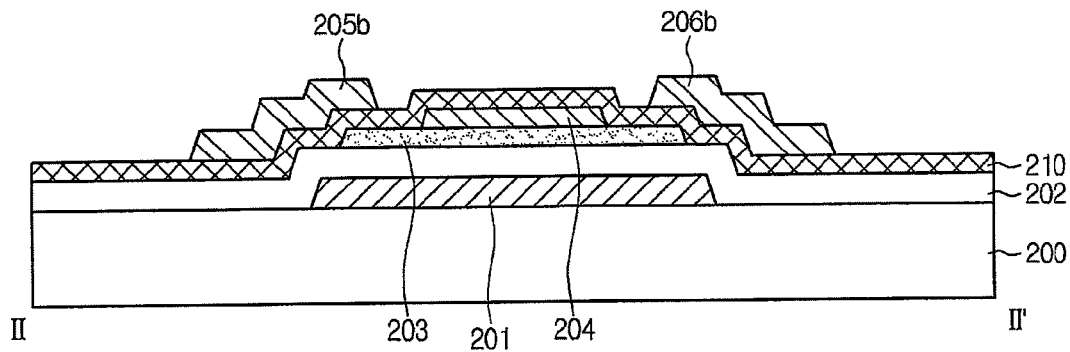

The metal layer 211 is patterned into a second source electrode layer 205b and a second drain electrode layer 206b as shown in FIG. 5E. Moreover, a data line layer, for example, can be formed through the patterning process of the metal layer 211. To this end, a photoresist pattern is formed on the metal layer 211 through a photoresist procedure and then the metal layer 211 is wet-etched using the photoresist pattern as an etching mask. The second source electrode layer 205b and the second drain electrode layer 206b are formed in such manner as to be separate from each other and partially overlap the active layer 203. Also, the second source electrode layer 205b and the second drain electrode layer 206b are separated from the etch stop layer 204, wherein the etch stop layer 204 is arranged therebetween.

Although the metal layer 211 is wet-etched, the active layer 203 is not exposed directly to an etchant because of the barrier layer 210 under the metal layer 211. In other words, the barrier layer 210 can prevent degeneration of the active layer 203 from a semiconductor into a conductor through a chemical reaction with the etchant which would have caused the active layer 203 to lose semiconductor properties. Consequently, the active layer 203 can be protected by the barrier layer 210 even though the etch stop layer 203 does not overlap the source electrode and the drain electrode.

Figure 5F:
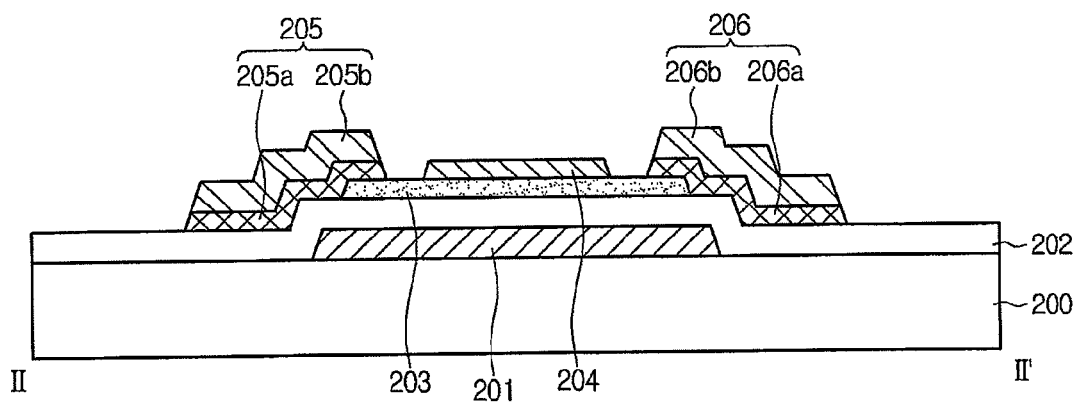

As shown in FIG. 5F, the barrier layer 210 is etched and patterned into a first source electrode layer 205a and a first drain electrode layer 206a. At this time, a first data line layer, for example, can be formed together with the first source and drain electrode layers 205a and 206a. The first source electrode layer 205a and second source electrode layer 205b form a source electrode 205, and the first drain electrode layer 206a and second drain electrode layer 206b form a drain electrode 206. Also, a data line is formed together with the source electrode 205 and drain electrode 206 through the etching processes of the metal layer 211 and the barrier layer 210. The barrier layer 210 is etched using the second source electrode layer 205b and the second drain electrode layer 206b as an etching mask. Also, the barrier layer 210 can be etched in a dry etching method.

The source electrode 205 and the drain electrode 206 are formed in the same layer as the etch stop layer 204. Also, the source electrode 205 and the drain electrode 206 are formed in regions on the gate insulation film 202 which partially overlap the active layer 203 but do not overlap the etch stop layer 204.

Figure 5G:
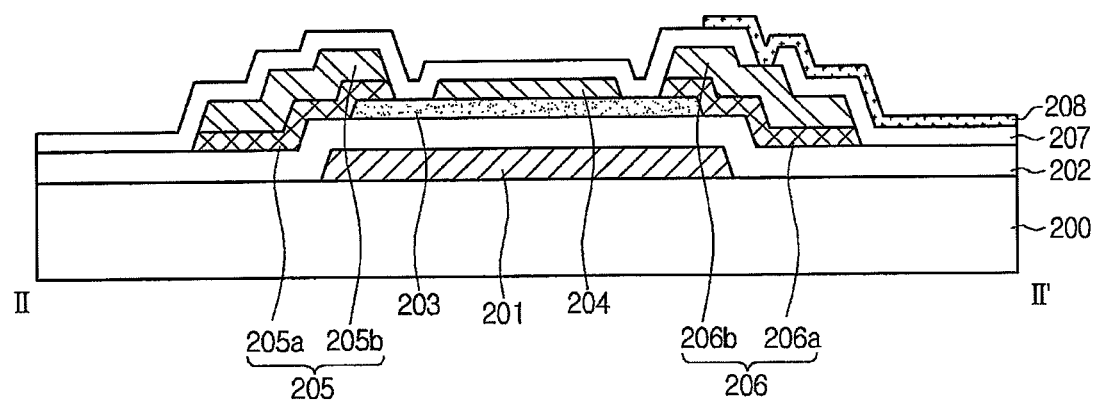

Referring to FIG. 5G, a passivation film 207 with a contact hole is formed on the entire surface of the substrate 200 provided with the source electrode 205 and drain electrode 206. The contact hole formed in the passivation film 207 exposes a part of the drain electrode 206. Also, a pixel electrode 208 is formed on the passivation film 207 provided with the contact hole. The pixel electrode 208 is formed throughout a pixel region which is defined by the gate line and the data line crossing each other. Also, the pixel electrode 208 is formed in such a manner as to be separate from the data line and the gate line. Moreover, the pixel electrode 208 is electrically connected to the drain electrode 206 via the contact hole. The contact hole of the passivation film 207 and the pixel electrode 208 can be provided by forming a photoresist pattern through a photoresist procedure and etching the passivation film 207 or a pixel electrode material using the photoresist pattern as an etching mask.

Figure 6:
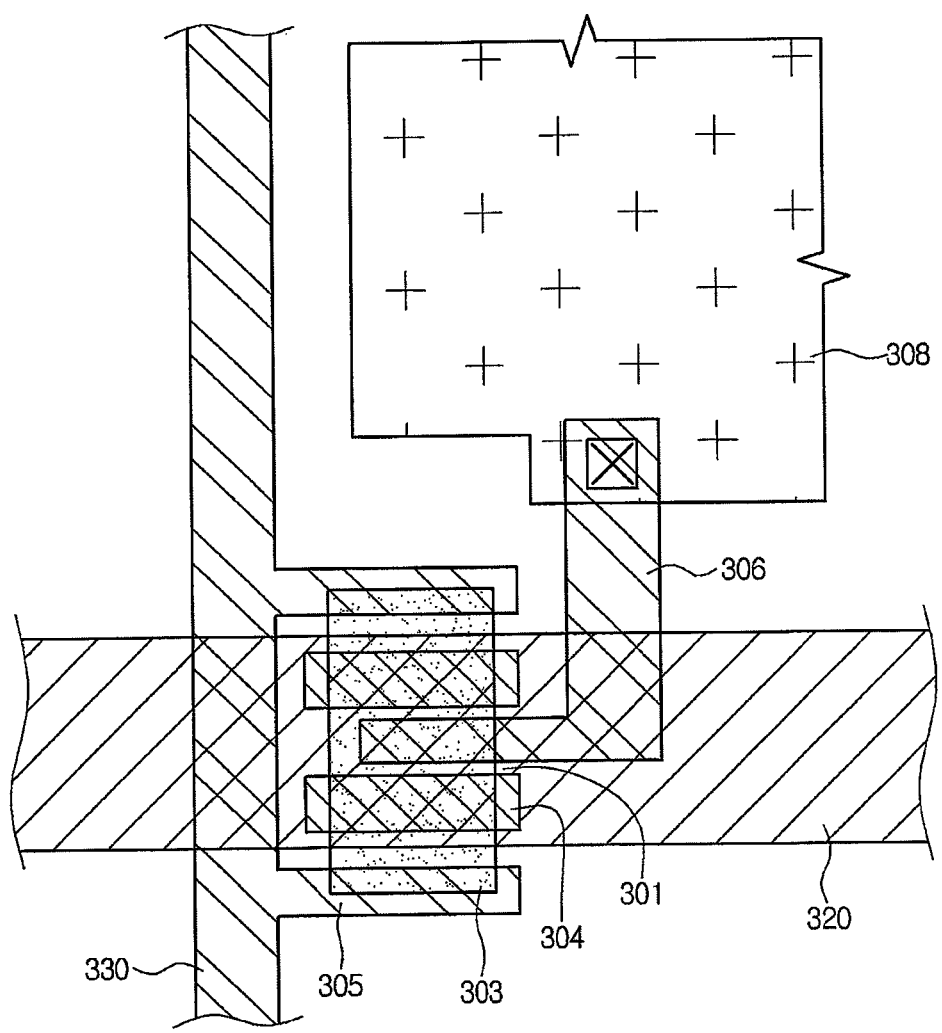
FIG. 6 is a planar view showing an example of a thin film transistor array substrate according to a third embodiment of the present disclosure.

FIG. 6 is a planar view showing a thin film transistor array substrate according to a third embodiment of the present disclosure.

Referring to FIG. 6, the thin film transistor array substrate according to the third embodiment of the present disclosure includes a gate line 320 and a data line 330 which are formed on a substrate. The substrate includes a display area and a non-display area. The gate line 320 and the data line 330 cross each other and define a pixel region. The thin film transistor array substrate further includes a thin film transistor formed at an intersection of the gate line 320 and the data line 330, and a pixel electrode 308 which is formed in the pixel region and connected to the thin film transistor. The thin film transistor can be an oxide semiconductor thin film transistor. Also, the thin film transistor includes a gate electrode 301, a gate insulation film, an active layer 303, a source electrode 305 and a drain electrode 306. The thin film transistor can further include etch stop layers 304 on the active layer 303. The etch stop layer 304 can define a channel region of the active layer 303.

The etch stop layers 304 and the source electrode 305 and drain electrode 306 can be formed on the active layer 303 in the same layer, the etch stop layers 304 and the source and drain electrodes 306 partially overlapping the active layer 303. The etch stop layers 304 are arranged between the source electrode 305 and the drain electrode 306. Also, the etch stop layers 304 are formed in such a manner as to be separate from the source electrode 305 and the drain electrode 306.

The source electrode 305 and the drain electrode 306 can include a first electrode layer and a second electrode layer. The first electrode layer can be formed from materials that are different than the materials from which the second electrode layer can be formed. As such, the first electrode layer and the second electrode layer can be patterned independently of each other through different etching processes from each other. Also, the source electrode 305 is formed in a shape of 'U', and the drain electrode 306 is formed in such a manner as to be inserted into the U-shaped source electrode 305.

The U-shaped source electrode 305 includes first and second portions protruding from the data line 330 and a third portion corresponding to a part of the data line 330. At least one portion of the source electrode 305 is disposed in a region occupied by the gate electrode 301. In other words, at least one among the first through third portions of the source electrode 305 does not overlap the gate electrode 301. Preferably, both of the first and second portions of the source electrode 305 which protrude from the data line 330 are formed without overlapping the gate electrode 301. However, the source electrode 305 can be formed so that only one of the first and second portions of the source electrode 305 which protrude from the data line 330 does not overlap the gate electrode 301.

Figure 7:
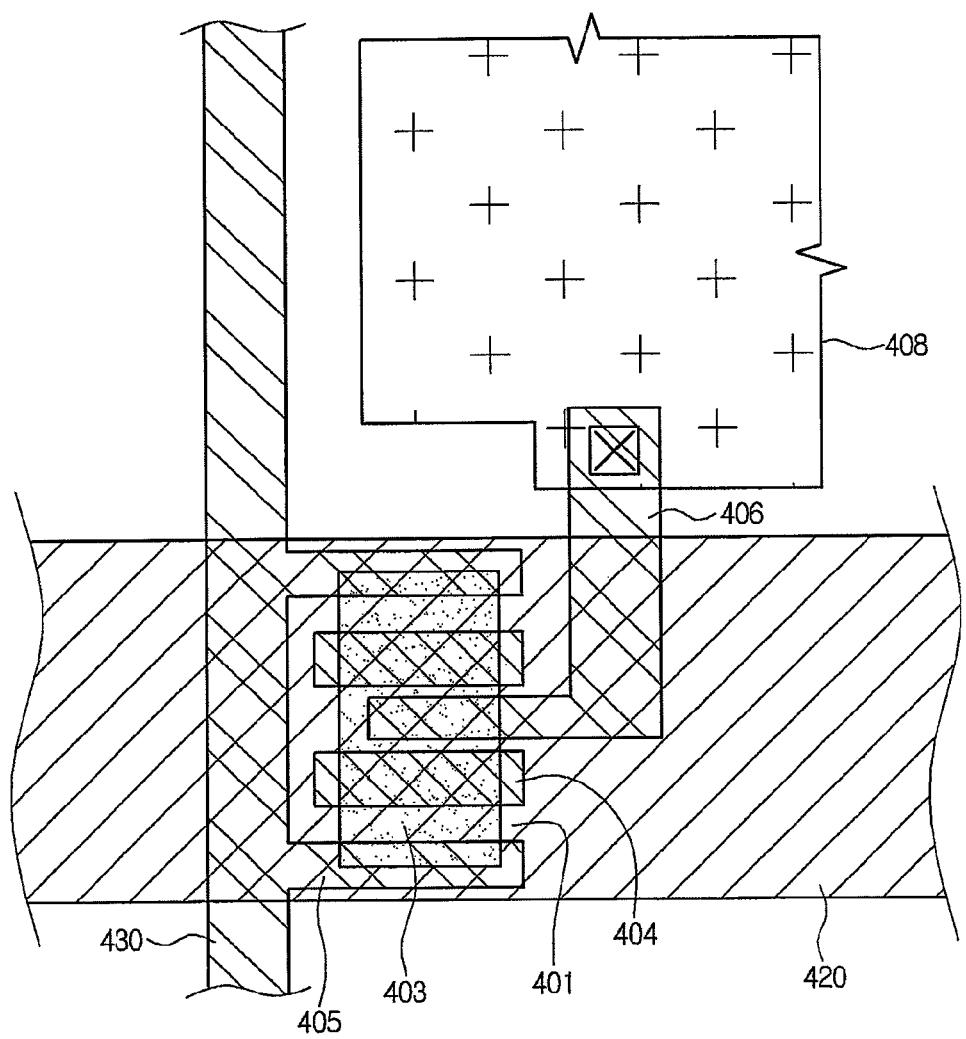
FIG. 7 is a planar view showing an example of a thin film transistor array substrate according to a fourth embodiment of the present disclosure.

FIG. 7 is a planar view showing an example of a thin film transistor array substrate according to a fourth embodiment of the present disclosure.

Referring to FIG. 7, the thin film transistor array substrate according to the fourth embodiment of the present disclosure includes a gate line 420 and a data line 430 which are formed on a substrate. The substrate can be defined into a display area and a non-display area. The gate line 420 and the data line 430 cross each other and define a pixel region. The thin film transistor array substrate further includes a thin film transistor formed at an intersection of the gate line 420 and the data line 430, and a pixel electrode 408 which is formed in the pixel region and connected to the thin film transistor. The thin film transistor can be an oxide semiconductor thin film transistor. Also, the thin film transistor includes a gate electrode 401, a gate insulation film, an active layer 403, a source electrode 405 and a drain electrode 406. The thin film transistor can further include etch stop layers 404 on the active layer 403. The etch stop layers 404 can define a channel region of the active layer 403.

The etch stop layers 404 and the source electrode 405 and drain electrode 406 can be formed on the active layer 403 in the same layer, the etch stop layers 404 and the source and drain electrodes 405 and 406 partially overlapping the active layer 403. The etch stop layers 404 are arranged between the source electrode 405 and the drain electrode 406. Also, the etch stop layers 404 are formed in such a manner as to be separate from the source electrode 405 and the drain electrode 406.

The source electrode 405 and the drain electrode 406 can include a first electrode layer and a second electrode layer. The first electrode layer can be formed from materials that are different than the materials from which the second electrode layer can be formed. As such, the first electrode layer and the second electrode layer can be patterned independently of each other through different etching processes from each other. Also, the source electrode 405 is formed in a shape of 'U', and the drain electrode 406 is formed in such a manner as to be inserted into the U-shaped source electrode 405. Moreover, the source electrode 405 is entirely formed over the gate electrode 401.

The active layer 403 is formed only within a region occupied by the gate electrode 401. In other words, the active layer 403 is formed only over the gate electrode 401. As such, the active layer 403 can be formed in a flat structure without any step height. If the active layer 403 is formed in another region not overlapping the gate electrode 401 as well as the overlapping region with the gate electrode 401, a step height is generated in the active layer 203. Due to this, the active layer 403 can be disconnected at its bent portion (or region). However, the thin film transistor according to a fourth embodiment of the present disclosure enables the active layer 403 to be formed only over the gate electrode 401. As such, disconnection of the active layer 403 can be prevented.

Figure 8:
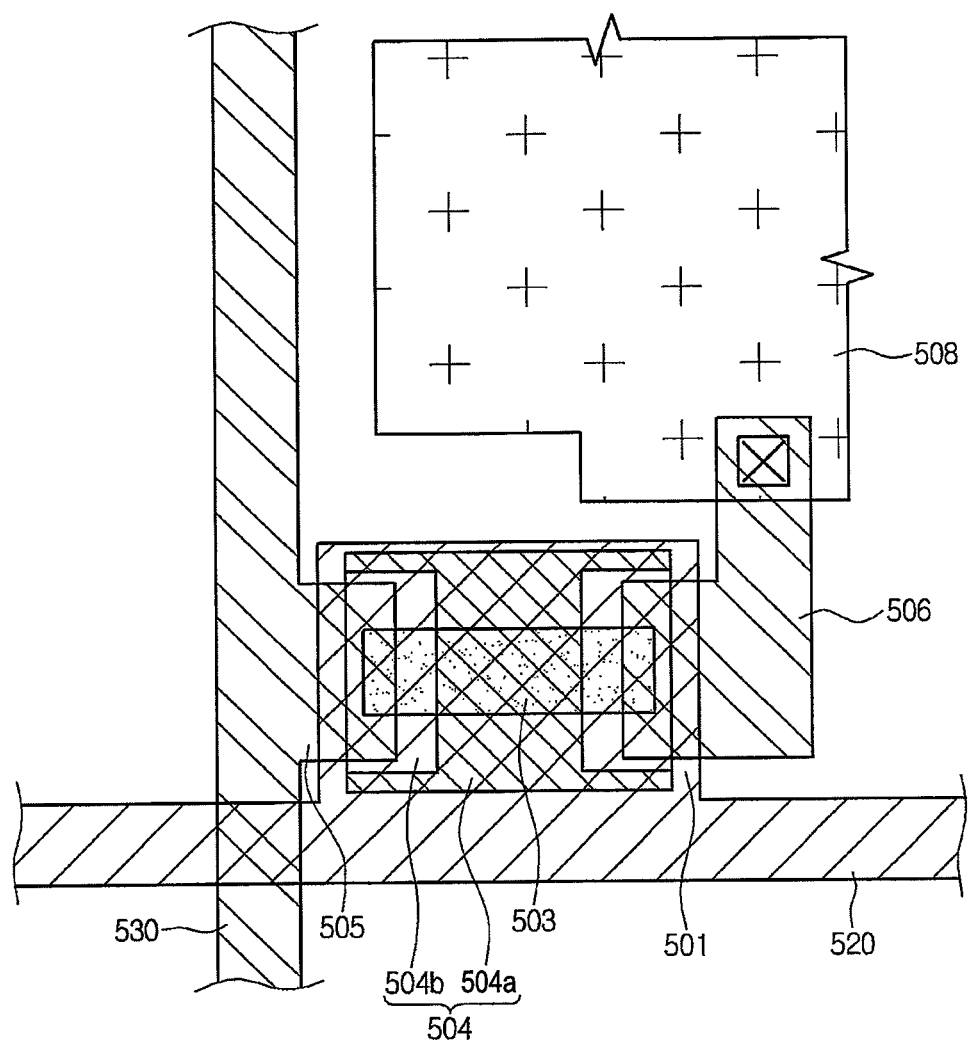
FIG. 8 is a planar view showing an example of a thin film transistor array substrate according to a fifth embodiment of the present disclosure.

FIG. 8 is a planar view showing an example of a thin film transistor array substrate according to a fifth embodiment of the present disclosure.

The thin film transistor array substrate of the fifth embodiment, which is shown in FIG. 8, has the same configuration as that of the second embodiment with the exception of an etch stop layer 504. Referring to FIG. 8, the thin film transistor array substrate according to the fifth embodiment of the present disclosure includes a gate line 520 and a data line 530 which are formed on a substrate. The gate line 520 and the data line 530 cross each other and define a pixel region. The thin film transistor array substrate further includes a thin film transistor formed at an intersection of the gate line 520 and the data line 530, and a pixel electrode 508 which is formed in the pixel region and connected to the thin film transistor. The thin film transistor includes a gate electrode 501, a gate insulation film, an active layer 503, an etch stop layer 504, a source electrode 505 and a drain electrode 506.

The etch stop layer 504 defining a channel region of the active layer 503 includes a pattern portion 504a and recesses 504b formed in both edges of the pattern portion 504a. The recesses 504b of the etch stop layer 504 are formed in regions occupied by the source electrode 505 and the drain electrode 506. On the other hand, the pattern portion 504a of the etch stop layer 504 is formed in another region of the active layer 503 which is not occupied by the source electrode 505 and the drain electrode 506. In other words, the etch stop layer 504 formed on the active layer 503 forces the recesses 504b to the regions of the etch stop layer 504 occupied by the source electrode 505 and the drain electrode 506. As such, the pattern portion 504a of the etch stop layer 504 is formed in such a manner as to be separate from the source electrode 505 and the drain electrode 506.

The sizes of the recesses 504b is enough to separate the pattern portion 504a of the etch stop layer 504 from the source electrode 505 and the drain electrode 506. Also, the recesses 504b can be formed in different shapes from those shown in FIG. 8.

Figure 9:
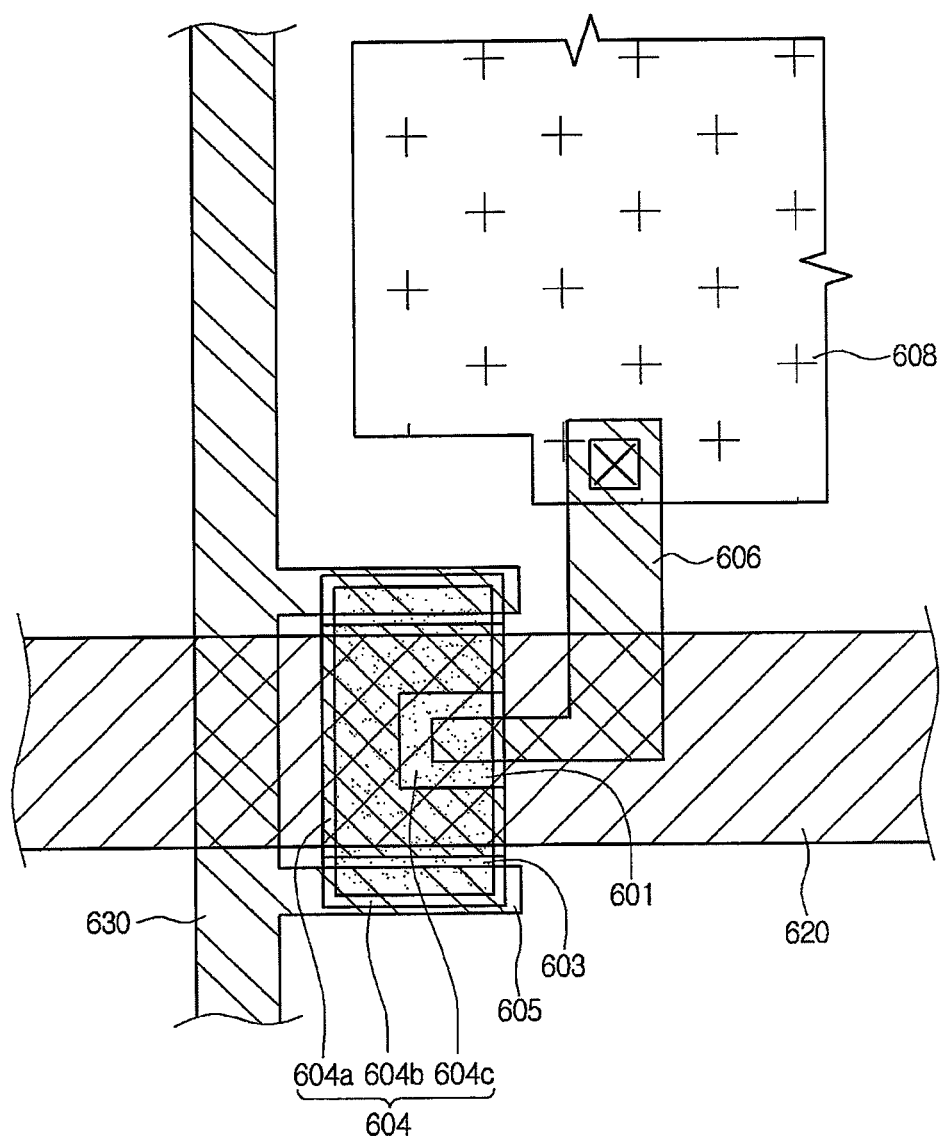
FIG. 9 is a planar view showing an example of a thin film transistor array substrate according to a sixth embodiment of the present disclosure.

FIG. 9 is a planar view showing an example of a thin film transistor array substrate according to a sixth embodiment of the present disclosure.

The thin film transistor array substrate of the sixth embodiment, which is shown in FIG. 9, has the same configuration as that of the third embodiment but the etch stop layer 304 has been replaced with an etch stop layer 604. Referring to FIG. 9, the thin film transistor array substrate according to the sixth embodiment of the present disclosure includes a gate line 620 and a data line 630 which are formed on a substrate. The gate line 620 and the data line 630 cross each other and define a pixel region. The thin film transistor array substrate further includes a thin film transistor formed at an intersection of the gate line 620 and the data line 630, and a pixel electrode 608 which is formed in the pixel region and connected to the thin film transistor. The thin film transistor includes a gate electrode 601, a gate insulation film, an active layer 603, an etch stop layer 604, a source electrode 605 and a drain electrode 606.

The etch stop layer 604 includes a pattern portion 604a, through holes 604b and a recess 604c. The through holes 604b are formed in regions of the etch stop layer 604 occupied by the source electrode 605 (i.e., the first and second portions of the source electrode 605). The recess 604c is formed in another region occupied by the drain electrode 606. As such, the pattern portion 604a of the etch stop layer 604 can be formed in a different region of the etch stop layer 604 not overlapping the source electrode 605 and the drain electrode 606. In other words, the etch stop layer 604 disposed on the active layer 603 allows not only the through holes 604b to be formed in the regions the etch stop layer 604 occupied by the source electrode 605 (i.e., the first and second portions of the source electrode 605) but also the recess 604c to be formed in the region of the etch stop layer 604 occupied by the drain electrode 606.

The through holes 604b are sized to separate the pattern portion 604a of the etch stop layer 604 from the source electrode 605. Also, the through holes 604b can be formed in different shapes from those shown in FIG. 9. Similarly, the recess 604c is sized to separate the pattern portion 604a of the etch stop layer 604 from the drain electrode 606. Also, the recess 604c can be formed in a different shape from that shown in FIG. 9.

Figure 10:
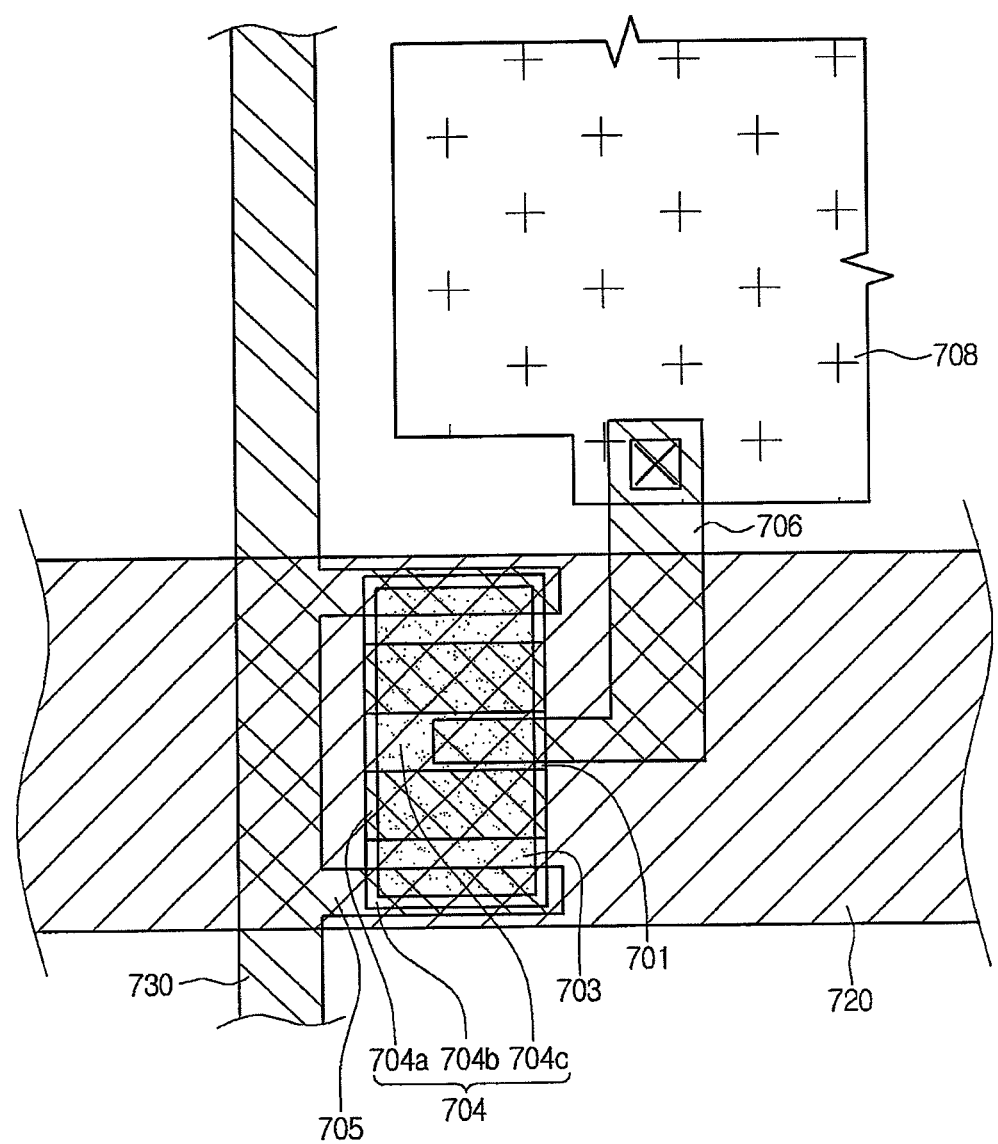
FIG. 10 is a planar view showing an example of a thin film transistor array substrate according to a seventh embodiment of the present disclosure.

FIG. 10 is a planar view showing an example of a film transistor array substrate according to a seventh embodiment of the present disclosure.

The thin film transistor array substrate of the seventh embodiment, which is shown in FIG. 10, has the same configuration as that of the fourth embodiment with the exception of an etch stop layer 704. Referring to FIG. 10, the thin film transistor array substrate according to the seventh embodiment of the present disclosure includes a gate line 720 and a data line 730 which are formed on a substrate. The gate line 720 and the data line 730 cross each other and define a pixel region. The thin film transistor array substrate further includes a thin film transistor formed at an intersection of the gate line 720 and the data line 730, and a pixel electrode 708 which is formed in the pixel region and connected to the thin film transistor. The thin film transistor includes a gate electrode 701, a gate insulation film, an active layer 703, an etch stop layer 704, a source electrode 705 and a drain electrode 706.

The etch stop layer 704 includes a pattern portion 704a, first through holes 704b and a second through hole 704c. The first through holes 704b are formed in regions of the etch stop layer 704 occupied by the source electrode 705 (i.e., the first and second portions of the source electrode 705). The second through hole 704c is formed in another region of the etch stop layer 704 occupied by the drain electrode 706. As such, the pattern portion 704a of the etch stop layer 704 can be formed in a different region of the etch stop layer 704 not overlapping the source electrode 705 and the drain electrode 706. In other words, the etch stop layer 704 disposed on the active layer 703 allows not only the first through holes 704b to be formed in the regions of the etch stop layer 704 occupied by the source electrode 705 (i.e., the first and second portions of the source electrode 705) but also the second through hole 704c to be formed in the region of the etch stop layer 704 occupied by the drain electrode 706.

The first through holes 704b are sized to separate the pattern portion 704a of the etch stop layer 704 from the source electrode 705. Also, the first through holes 704b can be formed in different shapes from those shown in FIG. 10. Similarly, the second through hole 704c is sized to separate the pattern portion 704a of the etch stop layer 704 from the drain electrode 706. Also, the second through hole 704c can be formed in a different shape from that shown in FIG. 10.

Each of the above-mentioned thin film transistors according to the present disclosure can be used as a thin film transistor which is included in each pixel drive circuit of a flat panel display device such as, for example, an LCD device or an OLED device. The configuration of the flat panel display device such as the LCD device or the OLED device is well known. As such, the description for the configuration of the flat panel display device will be omitted.

In this manner, the thin film transistor array substrates, and the fabricating methods thereof, of the current disclosure, allow the source and drain electrodes and the gate electrode of a thin film transistor to be formed so that the source and drain electrodes do not overlap the gate electrode. As such, undesirable parasitic capacitance can be reduced, and the thin film transistor can be driven at a high speed.

Also, the etch stop layer is formed to be separate from the source electrode and the drain electrode. As such, the channel region of the thin film transistor can be shortened. The shortened channel region length allows performance of the thin film transistor to be enhanced. Therefore, brightness and picture quality of a display panel can be also enhanced.

Moreover, the etch stop layer is formed through the rear exposure process which uses the gate electrode as a mask. As such, the number of masking procedures can be reduced and process time and fabrication costs can decrease.

In addition to the embodiments in the present disclosure as described above, it should be understood by a person having ordinary skill in the art that various changes or modifications can be made in the present invention without departing from the spirit or scope of the invention. Thus, it is intended that the present invention covers the modifications and variations of this invention provided they come within the scope of the appended claims and their equivalents.

What is claimed is:

1. A method of fabricating a thin film transistor array substrate, the method comprising:
   forming a gate electrode on a substrate;
   forming a gate insulation film on the substrate on the gate electrode;
   forming an active layer on the gate insulation film;
   forming an etch stop layer to define a channel region of the active layer;
   sequentially forming a barrier layer and a metal layer on the gate insulation film, the active layer, and the etch stop layer; and
   forming a source electrode and a drain electrode which are spaced apart from the etch stop layer,
   wherein the etch stop layer is between the source and drain electrodes, and
   the formation of the source and drain electrodes includes:
      forming a barrier layer on the entire surface of the substrate provided with the etch stop layer;
      forming a metal layer on the barrier layer;
      forming a second source electrode layer and a second drain electrode layer by etching the metal layer; and
      forming a first source electrode layer and a first drain electrode layer by dry-etching the barrier layer using the second source and drain electrodes as an etching mask, and wherein the source electrode includes the first and second source electrode layers and the drain electrode includes the first and second drain electrode layers.

2. The method of claim 1, wherein the source and drain electrodes do not overlap the gate electrode.

3. The method of claim 1, wherein the formation of the etch stop layer includes:
   sequentially stacking an active protection layer and a photoresist on the substrate above the active layer;
   patterning the photoresist into a photoresist pattern on a partial region of the active protection layer overlapping the gate electrode, by performing a rear exposure for the photoresist using the gate electrode as a mask;
   patterning the active protection layer into the etch stop layer by etching the active protection layer using the photoresist pattern as an etching mask; and
   removing the photoresist pattern from the etch stop layer.

4. The method of claim 1, wherein the active layer is formed only in a region over the gate electrode.

5. The method of claim 1, wherein the source electrode is formed in a shape of U.

6. The method of claim 5, wherein both ends of the source electrode are arranged without overlapping the gate electrode.

7. The method of claim 5, wherein the source electrode is formed only in a region adjacent to the gate electrode.

8. The method of claim 1, wherein the second source and drain electrode layers are formed by wet-etching the metal layer.

* * * * *